(12) United States Patent
Utamaru

(10) Patent No.: US 8,710,881 B2
(45) Date of Patent: Apr. 29, 2014

(54) PLL CIRCUIT

(75) Inventor: Go Utamaru, Ibaraki (JP)

(73) Assignee: Advantest Corporation, Tokyo (JP)

( * ) Notice: Subject to any disclaimer, the term of this patent is extended or adjusted under 35 U.S.C. 154(b) by 226 days.

(21) Appl. No.: 12/791,299

(22) Filed: Jun. 1, 2010

(65) Prior Publication Data

US 2011/0018598 A1    Jan. 27, 2011

(30) Foreign Application Priority Data

Jun. 24, 2009    (JP) ................................. 2009-150231

(51) Int. Cl.
*H03L 7/06* (2006.01)

(52) U.S. Cl.
USPC ........... 327/147; 327/146; 327/155; 327/156; 375/375

(58) Field of Classification Search
USPC ...................... 327/141, 144–163; 331/15–17; 375/373–376
See application file for complete search history.

(56) References Cited

U.S. PATENT DOCUMENTS

| | | | |
|---|---|---|---|
| 5,694,062 A * | 12/1997 | Welch et al. ....................... | 327/3 |
| 6,239,634 B1 * | 5/2001 | McDonagh ..................... | 327/158 |
| 6,794,945 B2 * | 9/2004 | McDonald et al. ............ | 331/1 A |
| 7,605,662 B2 * | 10/2009 | Kobayashi et al. ............. | 331/11 |
| 7,646,223 B2 * | 1/2010 | Kim et al. ....................... | 327/156 |
| 2003/0169086 A1 * | 9/2003 | Lee et al. ....................... | 327/158 |
| 2006/0279363 A1 | 12/2006 | Shirasu | |
| 2007/0024335 A1 * | 2/2007 | Sato ............................... | 327/158 |
| 2007/0057708 A1 * | 3/2007 | Uehara et al. .................. | 327/156 |
| 2007/0247248 A1 * | 10/2007 | Kobayashi et al. ........... | 331/167 |
| 2009/0079477 A1 * | 3/2009 | Lee ............................... | 327/149 |
| 2009/0079719 A1 * | 3/2009 | Lee ............................... | 345/204 |
| 2011/0279156 A1 * | 11/2011 | Abbasi et al. .................. | 327/158 |

FOREIGN PATENT DOCUMENTS

| | | |
|---|---|---|
| JP | 4-8016 | 1/1992 |
| JP | 2000-40959 | 2/2000 |
| JP | 2000-349625 | 12/2000 |

OTHER PUBLICATIONS

Japan Office Action, issued Dec. 17, 2012, for corresponding Japanese Patent Application No. 2009-150231 (together with English language translation).

* cited by examiner

*Primary Examiner* — Brandon S Cole

(74) *Attorney, Agent, or Firm* — Greenblum & Bernstein, P.L.C.

(57) ABSTRACT

A PLL circuit according to the present invention includes a VCO that outputs an VCO signal having a frequency according to an input voltage, a loop filter that feeds a voltage according to an input current to the VCO, a phase comparator that outputs a phase difference pulse having a width according to a phase difference between a first input signal and a second input signal, a charge pump circuit that receives the phase difference pulse, and inputs the current to the loop filter, and a phase-difference-pulse stop unit that stops the input of the phase difference pulse to the charge pump circuit in a non-input state in which an REF signal (reference frequency signal) is not input. The first input signal is the REF signal itself or a signal obtained by dividing the frequency of the REF signal, and the second input signal is the VCO signal itself or a signal obtained by dividing the frequency of the VCO signal.

16 Claims, 12 Drawing Sheets

PLL CIRCUIT

BACKGROUND ART

1. Field of the Invention

The present invention relates to a PLL circuit.

2. Description of the Prior Art

Conventionally, a PLL (Phase Locked Loop) circuit has been known (refer to a Patent Document 1, for example). A reference frequency signal is input to the PLL circuit. When the reference frequency signal is no longer input to the PLL circuit, a current continues to flow to a charge pump circuit disposed between a loop filter and a phase comparator of the PLL circuit from the loop filter of the PLL circuit. As a result, an operational amplifier constructing the loop filter saturates.
(Patent Document 1) Japanese Laid-Open Patent Publication (Kokai) No. 2000-40959

SUMMARY OF THE INVENTION

It is therefore an object of the present invention to prevent the current from continuing to flow to the charge pump circuit from the loop filter when the reference frequency signal is no longer input to the PLL circuit.

According to the present invention, a PLL circuit which receives an input of a reference pulse, and outputs an output pulse, includes: a voltage controlled oscillator that outputs the output pulse having a frequency according to an input voltage; a loop filter that feeds a voltage according to an input current to the voltage controlled oscillator; a phase comparator that outputs a phase difference pulse having a width according to a phase difference between a first input signal and a second input signal; a charge pump circuit that receives the phase difference pulse, and inputs the current to the loop filter; and a phase-difference-pulse stop unit that stops the input of the phase difference pulse to the charge pump circuit in a non-input state in which the reference pulse is not input, wherein: the first input signal is a signal based on the reference pulse; and the second input signal is a signal based on the output pulse.

The thus constructed PLL circuit receives an input of a reference pulse, and outputs an output pulse. A voltage controlled oscillator outputs the output pulse having a frequency according to an input voltage. A loop filter feeds a voltage according to an input current to the voltage controlled oscillator. A phase comparator outputs a phase difference pulse having a width according to a phase difference between a first input signal and a second input signal. A charge pump circuit receives the phase difference pulse, and inputs the current to the loop filter. A phase-difference-pulse stop unit stops the input of the phase difference pulse to the charge pump circuit in a non-input state in which the reference pulse is not input. The first input signal is a signal based on the reference pulse; and the second input signal is a signal based on the output pulse.

According to the PLL circuit of the present invention, the first input signal may be the reference pulse itself, or a pulse obtained by dividing the frequency of the reference pulse; and the second input signal may be the output pulse itself, or a pulse obtained by dividing the frequency of the output pulse.

According to the PLL circuit of the present invention, the charge pump circuit may input a positive current to the loop filter when the frequency of the second input signal is lower than the frequency of the first input signal, and input a negative current to the loop filter when the frequency of the second input signal is higher than the frequency of the first input signal.

According to the PLL circuit of the present invention, the phase-difference-pulse stop unit may stop the output of the phase difference pulse from the phase comparator in the non-input state.

According to the PLL circuit of the present invention, the phase-difference-pulse stop unit may include a non-input-state detector that detects the non-input state in which the reference pulse is not input, and receive a detection of the non-input state by the non-input-state detector, thereby stopping the output of the phase difference pulse from the phase comparator.

According to the present invention, the PLL circuit may include a delay element that delays the first input signal, and feed the delayed first input signal to the phase comparator.

According to the PLL circuit of the present invention, the delay time by the delay element may be equal to or longer than a detection response time which is from a time point when the reference pulse is input for the last time to a time point when the non-input-state detector detects the non-input state and outputs a non-input-detection signal.

According to the PLL circuit of the present invention, the phase-difference-pulse stop unit may receive a non-input-state signal indicating the non-input state from a reference pulse generation device that generates the reference pulse, thereby stopping the output of the phase difference pulse from the phase comparator.

According to the PLL circuit of the present invention, the phase-difference-pulse stop unit may include a phase-difference-pulse relay unit that receives the phase difference pulse, and feeds the phase difference pulse to the charge pump circuit; and the phase-difference-pulse relay unit does not feed the phase difference pulse to the charge pump circuit in the non-input state.

According to the PLL circuit of the present invention, the phase-difference-pulse stop unit may include a non-input-state detector that detects the non-input state in which the reference pulse is not input; and the phase-difference-pulse relay unit may receive a detection of the non-input state by the non-input-state detector, thereby preventing the phase difference pulse from being fed to the charge pump circuit.

According to the present invention, the PLL circuit may includes a delay element that delays the first input signal, and feeds the delayed first input signal to the phase comparator.

According to the PLL circuit of the present invention, the delay time by the delay element may be equal to or longer than a detection response time which is from a time point when the reference pulse is input for the last time to a time point when the non-input-state detector detects the non-input state and outputs a non-input-detection signal.

According to the PLL circuit of the present invention, the phase-difference-pulse relay unit may receive a non-input-state signal indicating the non-input state from a reference pulse generation device that generates the reference pulse, thereby preventing the phase difference pulse from being fed to the charge pump circuit.

According to the PLL circuit of the present invention, the non-input state may be set while the non-input-state signal is output from the reference pulse generation device.

BEST MODE FOR CARRYING OUT THE INVENTION

A description will now be given of embodiments of the present invention referring to drawings.

First Embodiment

Figure 1:
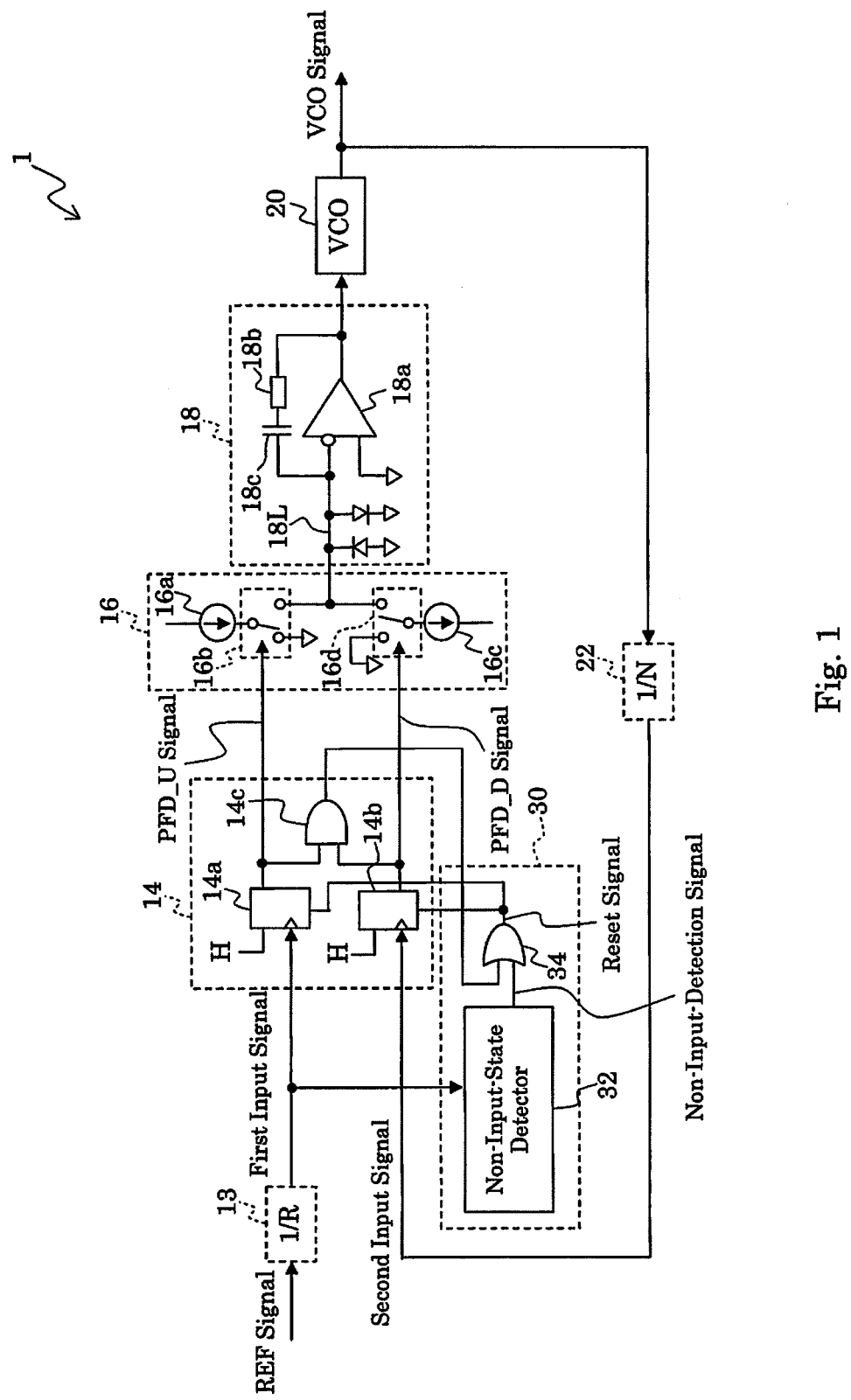
FIG. 1 is a diagram showing a configuration of a PLL circuit 1 according to a first embodiment of the present invention.

FIG. 1 is a diagram showing a configuration of a PLL circuit 1 according to a first embodiment of the present invention. The PLL (Phase Locked Loop) circuit 1 receives an input of an REF signal (reference pulse), and outputs a VCO signal (output pulse).

The PLL circuit 1 according to the first embodiment includes a frequency divider 13, a phase comparator 14, a charge pump circuit 16, a loop filter 18, a VCO (Voltage Controlled Oscillator) 20, a frequency divider 22, and a phase-difference-pulse stop unit 30.

The VCO 20 outputs a VCO signal (output pulse) having a frequency according to a voltage input from the loop filter 18.

The loop filter 18 feeds the voltage according to a current input from the charge pump circuit 16 to the VCO 20. The loop filter 18 includes an operational amplifier 18a, a resistor 18b, a capacitor 18c, and a line 18L.

The operational amplifier 18a receives the current input from the charge pump circuit 16 on a negative input terminal through the line 18L. It should be noted that a positive input terminal of the operational amplifier 18a is grounded. Moreover, two diodes are connected to the line 18L. One diode is connected to the line 18L at the anode (the cathode thereof is grounded). The other diode is connected to the line 18L at the cathode (the anode thereof is grounded). These two diodes can maintain the voltage impressed on the negative input terminal of the operational amplifier 18a in a predetermined range.

The resistor 18b is connected to an output terminal of the operational amplifier 18a.

The capacitor 18c is connected to the resistor 18b on one end, and to the line 18L on the other end.

The frequency divider 13 divides the REF signal (reference pulse) by R (R is a positive integer), and feeds the obtained signal as a first input signal to the phase comparator 14. The frequency divider 22 divides the VCO signal (output pulse) by N (N is a positive integer), and feeds the obtained signal as a second input signal to the phase comparator 14. It should be noted that a relationship R=N=1 may hold, and, in this case, the first input signal is the REF signal (reference pulse) itself, and the second input signal is the VCO signal (output pulse) itself. In the following section, a description will be given while assuming that the relationship R=N=1 holds. Then, the frequency divider 13 and the frequency divider 22 can be neglected.

The phase comparator 14 outputs a phase difference pulse (PFD_U signal or PFD_D signal) having a width according to a phase difference between the first input signal (REF signal) and the second input signal (VCO signal). If the frequency of the second input signal is lower than the frequency of the first input signal, the PFD_U signal is used as the phase difference pulse. Moreover, if the frequency of the second input signal is higher than the frequency of the first input signal, the PFD_D signal is used as the phase difference pulse (refer to FIG. 2, for example).

The phase comparator 14 includes an REF-side flip-flop 14a, a VCO-side flip-flop 14b, and an AND circuit 14c.

The REF-side flip-flop 14a includes a D input terminal on the upper left side, a clock input terminal on the lower left side, a Q output terminal on the upper right side, and a reset terminal at the lower center. A signal at the H (High) level is always input to the D input terminal. The first input signal (REF signal) is input to the clock input terminal. When the input to the clock input terminal rises from the L (Low) level to the H (High) level, the input to the D input terminal is output from the Q output terminal. However, when a signal at the H level is input to the reset terminal, the output from the Q output terminal goes L.

The VCO-side flip-flop 14b has the same structure and the input/output relationship as those of the REF-side flip-flop 14a. For the sake of illustration, the Q output terminal of the VCO-side flip-flop 14b is shown on the lower right side. Moreover, to the clock input terminal of the VCO-side 14b, the second input signal (VCO signal) is input.

The AND circuit 14c receives the output form the REF-side flip-flop 14a and the output from the VCO-side flip-flop 14b, and outputs a signal at the H level when both of them are at the H level. In the other cases, the AND circuit 14c outputs a signal at the L level.

The charge pump circuit 16 receives the phase difference pulse, and inputs the current to the loop filter 16. The charge pump circuit 16 includes a constant current source 16a, a switch 16b, a constant current source 16c, and a switch 16d.

The constant current source 16a is connected to a positive voltage source (not shown) on one end, and to the switch 16b on the other end. The constant current source 16a causes a current to flow from the one end to the other end.

The switch 16b is constructed by a transistor, for example. When a signal at the H (High) level is input from a terminal on the left side, the constant current source 16*a* is connected to the line 18L. When a signal at the L (Low) level is input from the terminal on the left side, the constant current source 16*a* is grounded.

When the frequency of the second input signal is lower than the frequency of the first input signal, the terminal on the left side of the switch 16*b* receives the phase difference pulse (PFD_U signal). Thus, the constant current source 16*a* is connected to the line 18L, and the positive current is input to the loop filter 18 (charge flows into the loop filter 18).

The constant current source 16*c* is connected to a negative voltage source (not shown) on one end, and to the switch 16*d* on the other end. The constant current source 16*a* causes a current to flow from the other end to the one end.

The switch 16*d* is constructed by a transistor, for example. When a signal at the H (high) level is input from a terminal on the left side, the constant current source 16*c* is connected to the line 18L. When a signal at the L (Low) level is input from the terminal on the left side, the constant current source 16*c* is grounded.

When the frequency of the second input signal is higher than the frequency of the first input signal, the terminal on the left side of the switch 16*d* receives the phase difference pulse (PFD_D signal). Thus, the constant current source 16*c* is connected to the line 18L, and the negative current is input to the loop filter 18 (charge flows out from the loop filter 18).

The phase-difference-pulse stop unit 30 stops the input of the phase difference pulse (PFD_U signal or PFD_D signal) from the phase comparator 14 to the charge pump circuit 16 in a non-input state in which the REF signal (reference pulse) is not input to the PLL circuit 1. More specifically, the phase-difference-pulse stop unit 30 stops the output of the phase difference pulse from the phase comparator 14 in the non-input state.

The phase-difference-pulse stop unit 30 according to the first embodiment includes a non-input-state detector 32, and an OR circuit 34.

The non-input-state detector 32 detects the non-input state in which the REF signal (reference pulse) is not input. The non-input-state detector 32 receives the first input signal, and outputs a non-input-detection signal at the H (High) level when the first input signal stays in the L level for a predetermined period.

The OR circuit 34 receives the output from the non-input-state detector 32 and the output from the AND circuit 14*c*, and, when either of or both of the outputs are at the H (High) level, outputs a reset signal at the H level. The reset signal is fed to the reset terminals of the REF-side flip-flop 14*a* and the VCO-side flip-flop 14*b*.

As a result, the OR circuit 34 receives the detection (non-input-detection signal (level is H)) of the non-input state by the non-input-state detector 32, outputs the reset signal (level is H), and sets the outputs from the Q output terminals of the REF-side flip-flop 14*a* and the VCO-side flip-flop 14*b* to the L level. In other words, the output (PFD_U signal or PFD_D signal, which is the phase difference pulse) from the phase comparator 14 is stopped.

The OR circuit 34 receives the output from the non-input-state detector 32 and the output from the AND circuit 14*c*, and outputs a signal at the L (Low) level when both of the outputs are at the L level. In other words, the OR circuit 34 does not output the reset signal in this case.

A description will now be given of an operation of the first embodiment.

Figure 2:
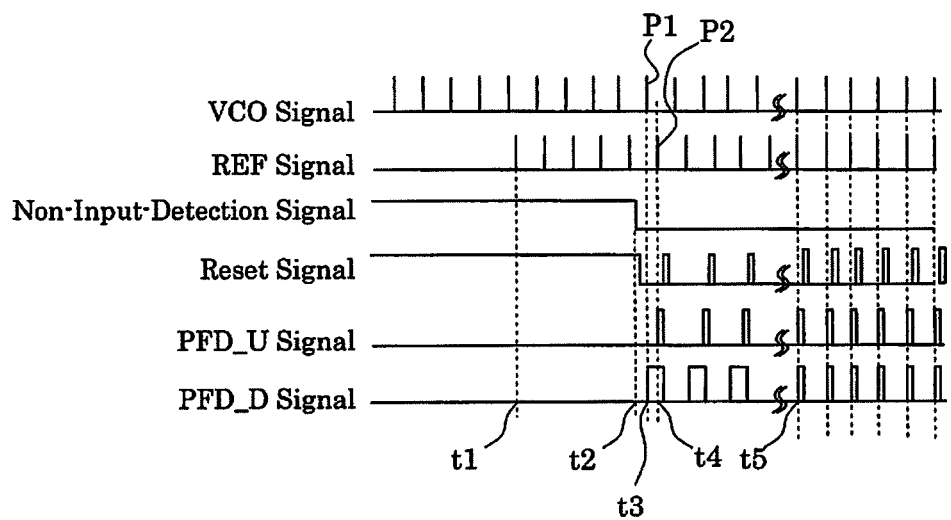
FIG. 2 is a time chart describing a transition from a state in which the REF signal (first input signal) is not input to a state in which the REF signal is input, according to the first embodiment.

FIG. 2 is a time chart describing a transition from a state in which the REF signal (first input signal) is not input to a state in which the REF signal is input, according to the first embodiment. The horizontal axis of FIG. 2 represents a time and the vertical axis represents a voltage (the same applies to FIGS. 3, 5, and 6). Moreover, it is assumed that when a signal is at the H (High) level, the signal is output, and when a signal is at the L (Low) level, the signal is not output (the same applies to FIGS. 3, 5, and 6).

FIG. 2 shows a transition from a state in which the frequency of the VCO signal is higher than the frequency of the REF signal to a state after a time t5 in which both of them are approximately the same.

First, before the REF signal (first input signal) is input (before a time t1), the output of the non-input-state detector 32 is at the H level, and the non-input-detection signal is thus output. Consequently, the output of the OR circuit 34 is at the H level, and the reset signal is thus output. The output reset signal is fed to the reset terminals of the REF-side flip-flop 14*a* and the VCO-side flip-flop 14*b*. As a result, the outputs from the REF-side flip-flop 14*a* and the VCO-side flip-flop 14*b* of the phase comparator 14 go L, and the outputs of the PFD_U signal and PFD_D signal are stopped.

Until a predetermined period (from the time t1 to a time t2) has elapsed after the REF signal (first input signal) was input, the non-input-detection signal continues to be output from the non-input-state detector 32. Thus, the outputs of the PFD_U signal and the PFD_D signal from the phase comparator 14 maintain stopped.

After the predetermined period has elapsed after the REF signal (first input signal) was input (after time t2), the output of the non-input-state detector 32 becomes the L level, and the output of the non-input-detection signal is stopped. At the time t2, the outputs from the REF-side flip-flop 14*a* and the VCO-side flip-flop 14*b* of the phase comparator 14 are at the L level, and the output from the AND circuit 14*c* is at the L level. Consequently, the output from the OR circuit 34 receiving the output from the non-input-state detector 32 and the output from the AND circuit 14*c* goes L, and the output of the reset signal stops. More precisely, at a time slightly after the time t2 due to processing in the OR circuit 34 and the like, the output of the reset signal stops.

At a time t3, the VCO signal is output from the VCO 20, and is input as the second input signal (pulse P1) to the VCO-side flip-flop 14*b* of the phase comparator 14. From the time point when the second input signal is fed to the VCO-side flip-flop 14*b* (time t3), the PFD_D signal is output. In other words, since the second input signal (VCO signal) fed to the clock input terminal on the lower left side of the VCO-side flip-flop 14*b* rises from the L level to the H level at the time t3, the signal at the H level input to the D input terminal is output from the Q output terminal on the lower right side of the VCO-side flip-flop 14*b*. Thus, the output of the Q output terminal on the lower right side of the VCO-side flip-flop 14*b* goes H, and the PFD_D signal is output.

When the PFD_D signal is output, the switch 16*d* connects the constant current source 16*c* to the line 18L. As a result, the negative current is input to the loop filter 18 (the charge flows out from the loop filter 18). As a result, the voltage fed from the loop filter 18 to the VCO 20 decreases. Consequently, the frequency of the VCO signal decreases, and approaches the frequency of the REF signal more.

At a time t4, the REF signal is input, and is fed as the first input signal (pulse P2) to the REF-side flip-flop 14*a* of the phase comparator 14. From the time point when the first input signal is fed to the REF-side flip-flop 14*a* (time t4), the PFD_U signal is output. In other words, since the first input signal (REF signal) fed to the clock input terminal on the lower left side of the REF-side flip-flop 14*a* rises from the L level to the H level at the time t4, the signal at the H level input to the D input terminal is output from the Q output terminal on the upper right side of the REF-side flip-flop 14*a*. Thus, the output of the Q output terminal on the upper right side of the REF-side flip-flop 14*a* goes H, and the PFD_U signal is output.

From the time t4, the PFD_U signal and the PFD_D signal are output. In other words, the output of the REF-side flip-flop 14*a* and the output of the VCO-side flip-flop 14*b* go H. As a result, the output of the AND circuit 14*c* goes H, and the output of the OR circuit 34 goes H, and the reset signal is thus output. More precisely, at a time slightly after the time t4 due to the processing in the OR circuit 34 and the like, the reset signal is output. As a result, the outputs from the REF-side flip-flop 14*a* and the VCO-side flip-flop 14*b* of the phase comparator 14 go L, and the outputs of the PFD_U signal and PFD_D signal are stopped.

Consequently, the phase comparator 14 outputs a phase difference pulse (PFD_D signal) approximately as wide as a time difference between the time t3 and the time t4. The time difference between the time t3 and the time t4 corresponds to a phase difference between the REF signal (reference pulse) and the VCO signal (output pulse). Therefore, the phase comparator 14 outputs the phase difference pulse (PFD_D signal) having the width according to the phase difference between the REF signal (first input signal) and the VCO signal (second input signal).

After the time t4, due to the output of the phase difference pulse (PFD_D signal), the frequency of the VCO signal decreases, and the approach closer to the frequency of the REF signal repeats. Then, after a time t5, both of them are approximately equal to each other. After the time t5, an operation in which the reset signal is output after the PFD_U signal and the PFD_D signal are output for a short period, and the outputs of the PFD_U signal and the PFD_D signal are stopped is repeated.

Figure 3:
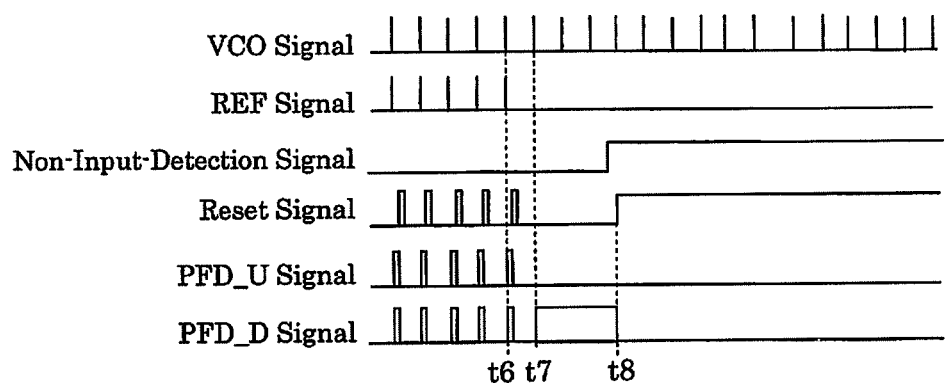
FIG. 3 is a time chart describing a transition from a state in which the REF signal (first input signal) is input to a state in which the REF signal is not input, according to the first embodiment.

FIG. 3 is a time chart describing a transition from a state in which the REF signal (first input signal) is input to a state in which the REF signal is not input, according to the first embodiment.

From a time t6 at which the REF signal (reference pulse) and the VCO signal (output pulse) are simultaneously input for the last time, the PFD_U signal and the PFD_D signal are output. Then, a slight period elapses, the reset signal is output, and the outputs of the PFD_U signal and the PFD_D signal are thus stopped.

Then, it is assumed that the input of the REF signal (reference pulse) stops after the time t6. Then, starting from a time t7 (a time point at which the VCO signal (output pulse) rises for the first time after the time t6), the PFD_D signal is output. The REF signal (reference pulse) is not input, and the PFD_U signal is thus not output.

When a predetermined period has elapsed after the input of the REF signal (first input signal) stops, the output of the non-input-state detector 32 goes H, and the non-input-detection signal is thus output. Then, the output of the OR circuit 34 goes H, and the reset signal is thus output. The reset signal causes the output from the VCO-side flip-flop 14*b* of the phase comparator 14 to go L, and the output of the PFD_D signal is stopped.

If the phase-difference-pulse stop unit 30 were not present, the output of the PFD_D signal would continue, and the input of the negative current to the loop filter 18 would continue (the flow-out of the charge from the loop filter 18 would continue). As a result, the saturation would be generated in the operational amplifier 18*a*. This causes degradation in phase settling when the operational amplifier 18*a* recovers from the saturation. Further, this also causes degradation in phase settling caused by a heat balance between differential operations of the switches 16*b* and 16*d* of the charge pump circuit 16.

However, according to the first embodiment, the phase-difference-pulse stop unit 30 exists, and the output of the PFD_D signal is stopped at a time t8 at which the reset signal rises. As a result, it is possible to restrain the period in which the output of the PFD_D signal continues to the period from the time t7 to the time t8, resulting in a reduction of the period in which the input of the negative current to the loop filter 18 continues. In this way, it is possible to prevent the flow of the current to the charge pump circuit 16 from the loop filter 18 from continuing.

Second Embodiment

The PLL circuit 1 according to a second embodiment is different from the PLL circuit 1 according to the first embodiment in that the PLL circuit 1 according to the second embodiment includes a delay element 2.

Figure 4:
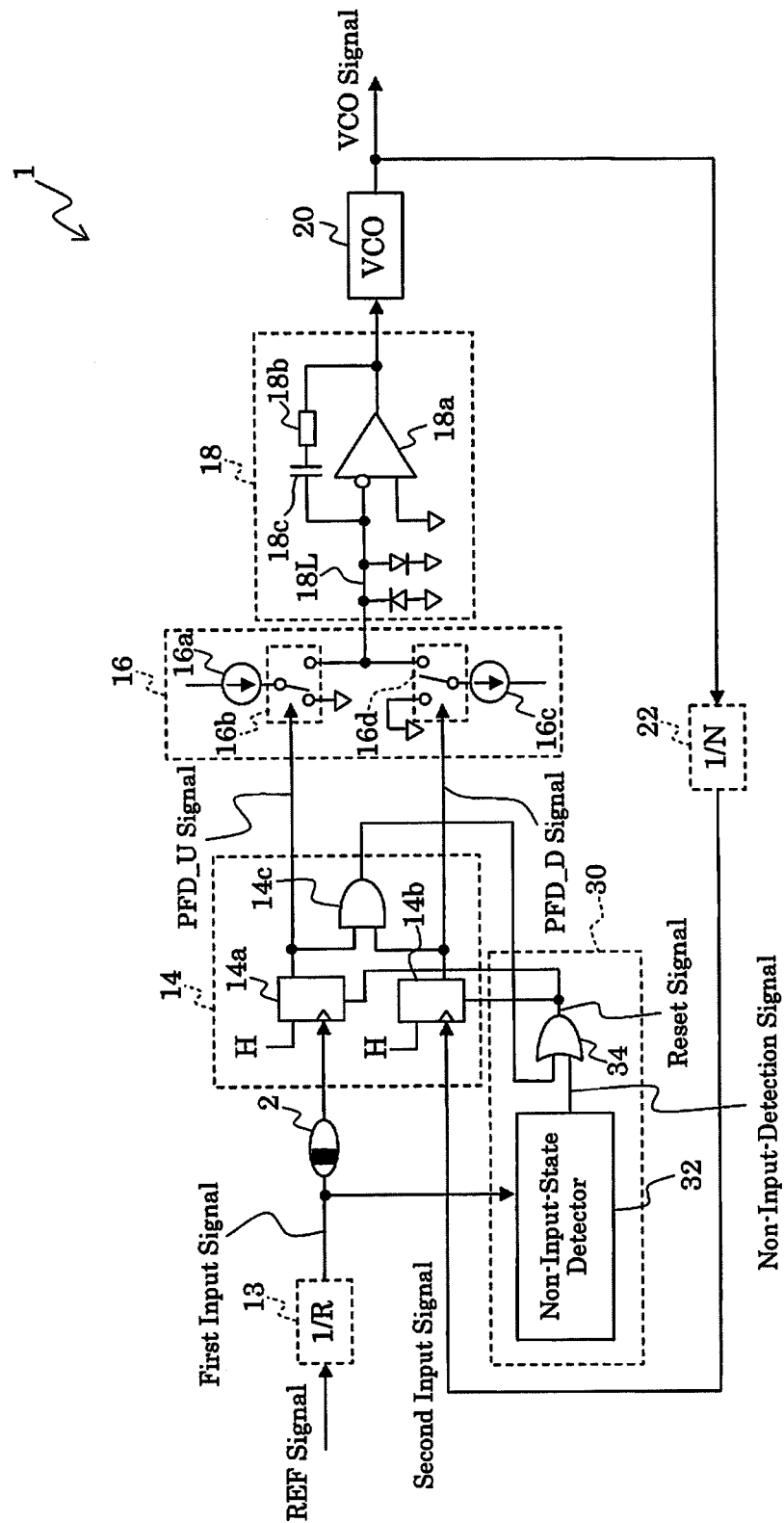
FIG. 4 is a diagram showing a configuration of the PLL circuit 1 according to the second embodiment of the present invention.

FIG. 4 is a diagram showing a configuration of the PLL circuit 1 according to the second embodiment of the present invention. The PLL circuit 1 according to the second embodiment includes the delay element 2, the frequency divider 13, the phase comparator 14, the charge pump circuit 16, the loop filter 18, the VCO (Voltage Controlled Oscillator) 20, the frequency divider 22, and the phase-difference-pulse stop unit 30. In the following section, the same components are denoted by the same numerals as of the first embodiment, and will be explained in no more details.

The frequency divider 13, the phase comparator 14, the charge pump circuit 16, the loop filter 18, the VCO 20, the frequency divider 22, and the phase-difference-pulse stop unit 30 are the same as those of the first embodiment, and hence a description thereof is omitted.

The delay element 2 delays the first input signal (REF signal), and feeds the delayed signal to the REF-side flip-flop 14*a* of the phase comparator 14. However, the first input signal fed to the non-input-state detector 32 of the phase-difference-pulse stop unit 30 is not delayed by the delay element 2. Moreover, a delay of the first input signal caused by the delay element 2 (delay time) is denoted by T1.

A description will now be given of an operation of the second embodiment.

Figure 5:
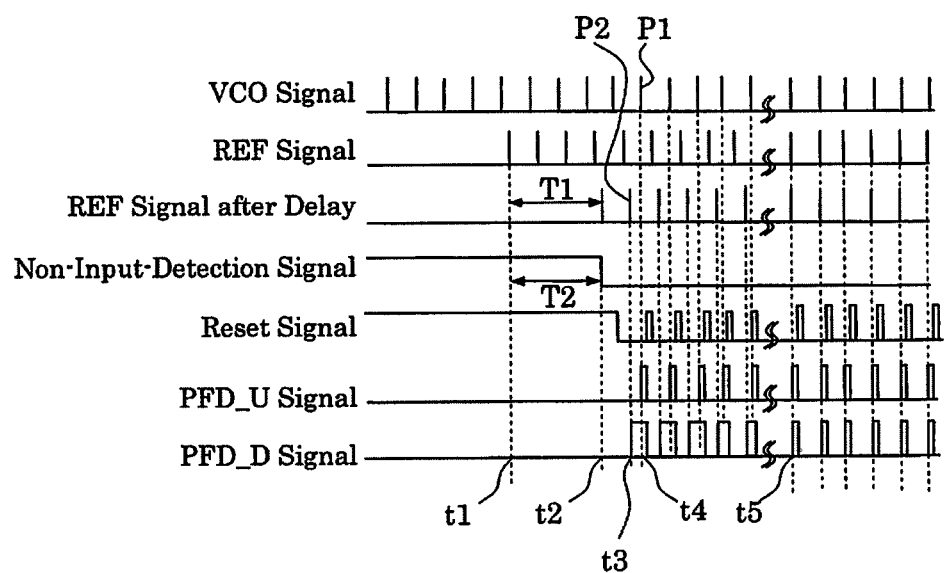
FIG. 5 is a time chart describing a transition from a state in which the REF signal (first input signal) is not input to a state in which the REF signal is input, according to the second embodiment.

FIG. 5 is a time chart describing a transition from a state in which the REF signal (first input signal) is not input to a state in which the REF signal is input, according to the second embodiment. It should be noted that the REF signal after the delay implies the REF signal delayed by the delay element 2.

There is no difference from the first embodiment except that the REF signal is delayed, and is then fed to the REF-side flip-flop 14*a* of the phase comparator 14.

A period from the time point t1 when the reference pulse (REF signal) is input for the first time to the time point t2 when the non-input-state detector 32 stops the output of the non-input-detection signal indicating the detection of the non-input state is denoted by T2. Moreover, it is assumed that a relationship T1=T2 holds.

Figure 6:
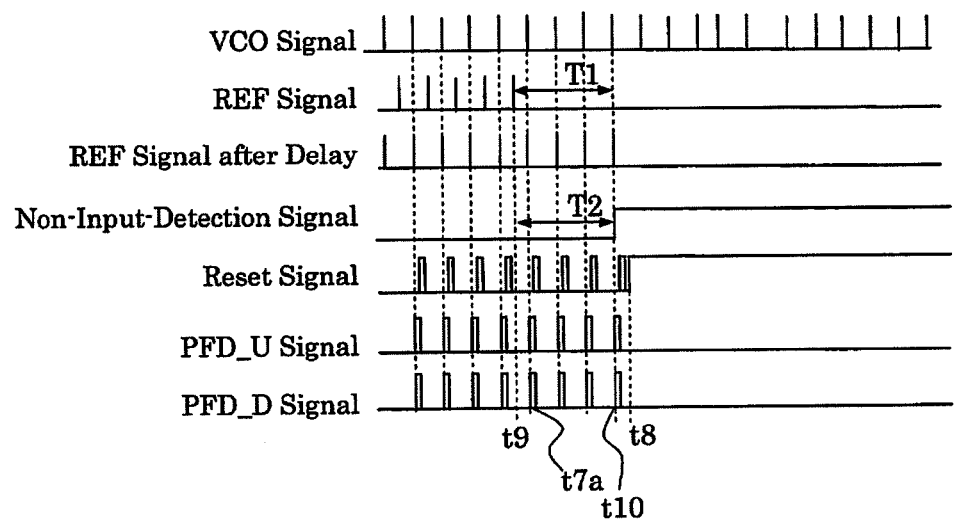
FIG. 6 is a time chart describing a transition from a state in which the REF signal (first input signal) is input to a state in which the REF signal is not input, according to the second embodiment.

FIG. 6 is a time chart describing a transition from a state in which the REF signal (first input signal) is input to a state in which the REF signal is not input, according to the second embodiment.

On this occasion, a period from a time point t9 when the reference pulse (REF signal) is input for the last time to a time point t10 when the non-input-state detector 32 outputs the non-input-detection signal indicating the detection of the non-input state is referred to as detection response time. Moreover, it is assumed that the detection response time is equal to T2.

Even after the time t9, the feed of the REF signal delayed by the delay element 2 to the REF-side flip-flop 14a of the phase comparator 14 continues. Moreover, the feed of the delayed REF signal and the feed of the VCO signal to the phase comparator 14 start almost simultaneously, and continue. As a result, the operation in which the reset signal is output after the PFD_U signal and the PFD_D signal are output for a short period, and the outputs of the PFD_U signal and the PFD_D signal are stopped is repeated as the operation after the time t5 in FIG. 2. Also after a time t7a (the VCO signal (output pulse) rises for the first time after the time t9), this operation repeats similarly.

At the time t10, the output of the non-input-state detector 32 goes H, and the non-input-detection signal is output. Then, the output of the OR circuit 34 goes H at the time t8, and the reset signal is thus output. The reset signal causes the output from the VCO-side flip-flop 14b of the phase comparator 14 to go L, and the outputs of the PFD_U signal and the PFD_D signal are stopped.

According to the second embodiment, the phase-difference-pulse stop unit 30 exists, and the outputs of the PFD_U signal and the PFD_D signal are thus stopped at the time t8 at which the reset signal rises. This is the same effect as that of the first embodiment.

Moreover, according to the second embodiment, the REF signal is delayed by the delay element 2, and is then fed to the phase comparator 14, and it is thus possible to prevent the output of the PFD_D signal from continuing in the period from the time t7a to the time t8 (the PFD_D signal is output intermittently). The time t7a coincides with the time t7 according to the first embodiment if the delay by the delay element 2 is not present. Thus, it is possible to more efficiently reduce the continuous output of the PFD_D signal compared with the first embodiment in which the output of the PFD_D signal continues from the time t7 to the time t8 (refer to FIG. 3). In this way, it is possible to more efficiently prevent the flow of the current to the charge pump circuit 16 from the loop filter 18 from continuing than the first embodiment.

The description is given of the case in which the detection response time T2 and the delay time T1 are the same. Though the delay time T1 and the detection response time T2 are preferably the same, the relationship therebetween may be (delay time T1)≥(detection response time T2).

Third Embodiment

The PLL circuit 1 according to a third embodiment is different from the PLL circuit 1 according to the first embodiment in a point that the REF signal is input from a waveform generator 12 disposed outside the PLL circuit 1. Moreover, the PLL circuit 1 according to the third embodiment is different from the PLL circuit 1 according to the first embodiment in a point that the non-input-detection signal is not obtained from the non-input-state detector 32, but a non-input-state signal is obtained from the waveform generator 12.

Figure 7:
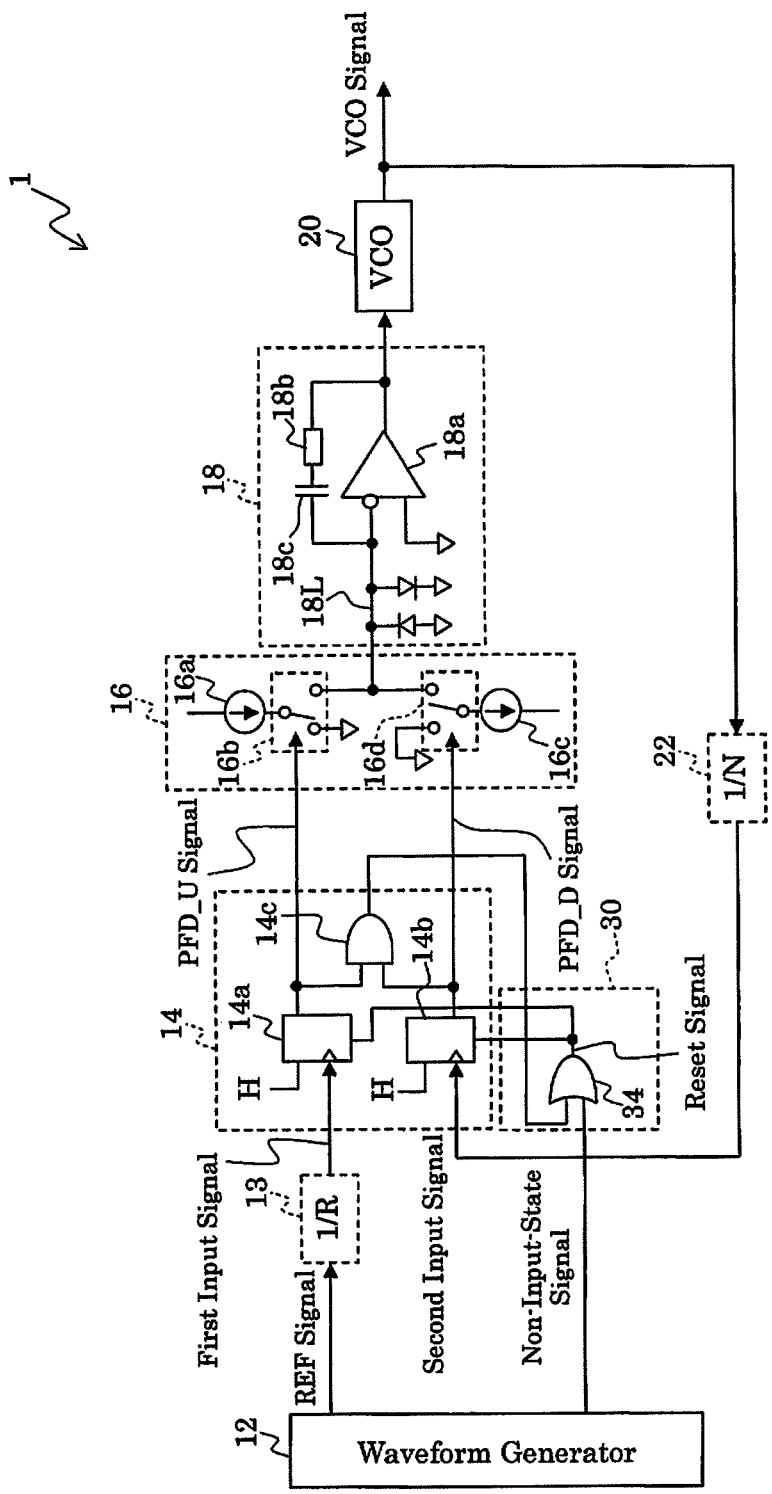
FIG. 7 is a diagram showing a configuration of the PLL circuit 1 according to the third embodiment of the present invention.

FIG. 7 is a diagram showing a configuration of the PLL circuit 1 according to the third embodiment of the present invention. The PLL circuit 1 according to the third embodiment is connected to the waveform generator (reference pulse generation device) 12. The PLL circuit 1 according to the third embodiment includes the frequency divider 13, the phase comparator 14, the charge pump circuit 16, the loop filter 18, the VCO (Voltage Controlled Oscillator) 20, the frequency divider 22, and the phase-difference-pulse stop unit 30. In the following section, the same components are denoted by the same numerals as of the first embodiment, and will be explained in no more details.

The frequency divider 13, the phase comparator 14, the charge pump circuit 16, the loop filter 18, the VCO 20, and the frequency divider 22 are the same as those of the first embodiment, and hence a description thereof is omitted.

The waveform generator (reference pulse generation device) 12 generates the REF signal (reference pulse). Moreover, the waveform generator 12 outputs the non-input-state signal indicating a non-input state in which the REF signal (reference pulse) is not input to the PLL circuit 1. The non-input-state signal is similar to the non-input-detection signal described in the second embodiment, and is a signal when the detection response time T2 according to the second embodiment is approximately 0.

The phase-difference-pulse stop unit 30 according to the third embodiment includes the OR circuit 34.

The OR circuit 34 receives the non-input-state signal and the output from the AND circuit 14c, and, when either of or both of them are at the H (High) level, outputs the reset signal at the H level. The reset signal is fed to the reset terminals of the REF-side flip-flop 14a and the VCO-side flip-flop 14b.

As a result, the OR circuit 34 receives the non-input-state signal (level is H) from the waveform generator (reference pulse generation device) 12, outputs the reset signal (level is H), and sets the outputs from the Q output terminals of the REF-side flip-flop 14a and the VCO-side flip-flop 14b to the L level. In other words, the output (PFD_U signal or PFD_D signal, which is the phase difference pulse) from the phase comparator 14 is stopped.

An operation of the third embodiment is the same as the operation of the first embodiment, and hence a description thereof is omitted. However, the time t1 and the time t2 are approximately simultaneous (refer to FIG. 2). Moreover, the time t6 (time when the REF signal and the VCO signal are simultaneously input for the last time) and the time t8 (time when the reset signal rises) are approximately simultaneous, and, at the time t7 (the time point when the VCO signal rises for the first time after the time t6), the PFD_D signal is thus not output (refer to FIG. 3).

According to the third embodiment, the phase-difference-pulse stop unit 30 exists, and the outputs of the PFD_U signal and the PFD_D signal are thus stopped at the time t8 when the reset signal rises. This is the same effect as that of the first embodiment.

Moreover, according to the third embodiment, the time t6 and the time t8 are approximately simultaneous, and the PFD_D signal is thus not output at the time t7. Thus, it is possible to more efficiently reduce the continuous output of the PFD_D signal compared with the first embodiment in which the output of the PFD_D signal continues from the time t7 to the time t8 (refer to FIG. 3). In this way, it is possible to more efficiently prevent the flow of the current to the charge pump circuit 16 from the loop filter 18 from continuing than the first embodiment.

As a variation of the third embodiment, it is conceivable that the non-input state is set after the non-input-state signal is output from the waveform generator 12 and while the non-input-state signal is output from the waveform generator 12.

Consequently, the time point when the REF signal is stopped may be set in a period when the non-input-state signal is output from the waveform generator 12, and a labor required for designing a circuit for the waveform generator 12 is thus reduced.

Fourth Embodiment

The PLL circuit 1 according to a fourth embodiment is different from the PLL circuit 1 according to the third embodiment in that the non-input-state signal is acquired from a waveform generation control unit 11 which controls the waveform generator 12.

Figure 8:
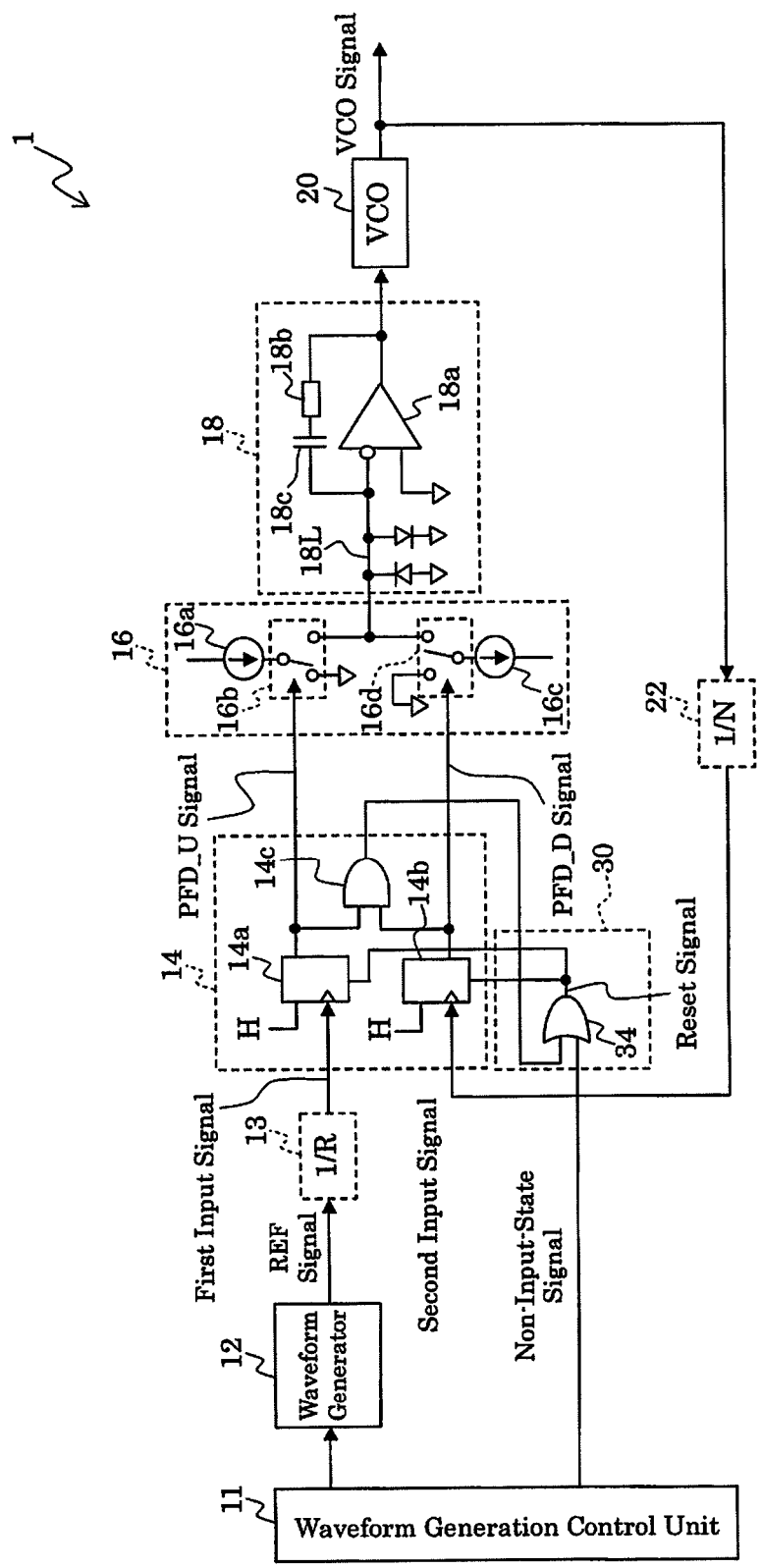
FIG. 8 is a diagram showing a configuration of the PLL circuit 1 according to the fourth embodiment of the present invention.

FIG. 8 is a diagram showing a configuration of the PLL circuit 1 according to the fourth embodiment of the present invention. The PLL circuit 1 according to the fourth embodiment is connected to the waveform generation control unit 11 and the waveform generator 12 which constitute the reference pulse generation device. The PLL circuit 1 according to the fourth embodiment includes the frequency divider 13, the phase comparator 14, the charge pump circuit 16, the loop filter 18, the VCO (Voltage Controlled Oscillator) 20, the frequency divider 22, and the phase-difference-pulse stop unit 30. In the following section, the same components are denoted by the same numerals as of the third embodiment, and will be explained in no more details.

The frequency divider 13, the phase comparator 14, the charge pump circuit 16, the loop filter 18, the VCO 20, the frequency divider 22, and the phase-difference-pulse stop unit 30 are the same as those of the third embodiment, and hence a description thereof is omitted.

The waveform generator (reference pulse generation device) 12 generates the REF signal (reference pulse).

The waveform generation control unit (reference pulse generation device) 11 controls a timing in which the waveform generator 12 generates the REF signal (reference pulse). Moreover, the waveform generation control unit 11 outputs the non-input-state signal indicating the non-input state in which the REF signal (reference pulse) is not input to the PLL circuit 1. It should be noted that the non-input-state signal is the same as the non-input-state signal described in the third embodiment.

The waveform generation control unit 11 may be realized as an electronic circuit. Moreover, the waveform generation control unit 11 may be realized by causing a computer provided with a CPU, a hard disk, and a media (such as a floppy disk (registered trade mark) and a CD-ROM) reader to read a medium recording a program, thereby installing the program on the hard disk.

An operation of the fourth embodiment is the same as the operation of the third embodiment, and hence a description thereof is omitted.

According to the fourth embodiment, there are obtained the same effects as in the third embodiment.

As a variation of the fourth embodiment, it is conceivable that the non-input state is set after the non-input-state signal is output from the waveform generation control unit 11 and while the non-input-state signal is output from the waveform generation control unit 11.

Consequently, the time point when the REF signal is stopped may be set in a period when the non-input-state signal is output from the waveform generation control unit 11, and a labor required for designing a circuit for the waveform generation control unit 11 is thus reduced.

Fifth Embodiment

The PLL circuit 1 according to a fifth embodiment is different from the PLL circuit 1 according to the first embodiment in that the phase-difference-pulse stop unit includes AND circuits (phase-difference-pulse relay units) 36a, 36b in place of the OR circuit 34.

Figure 9:
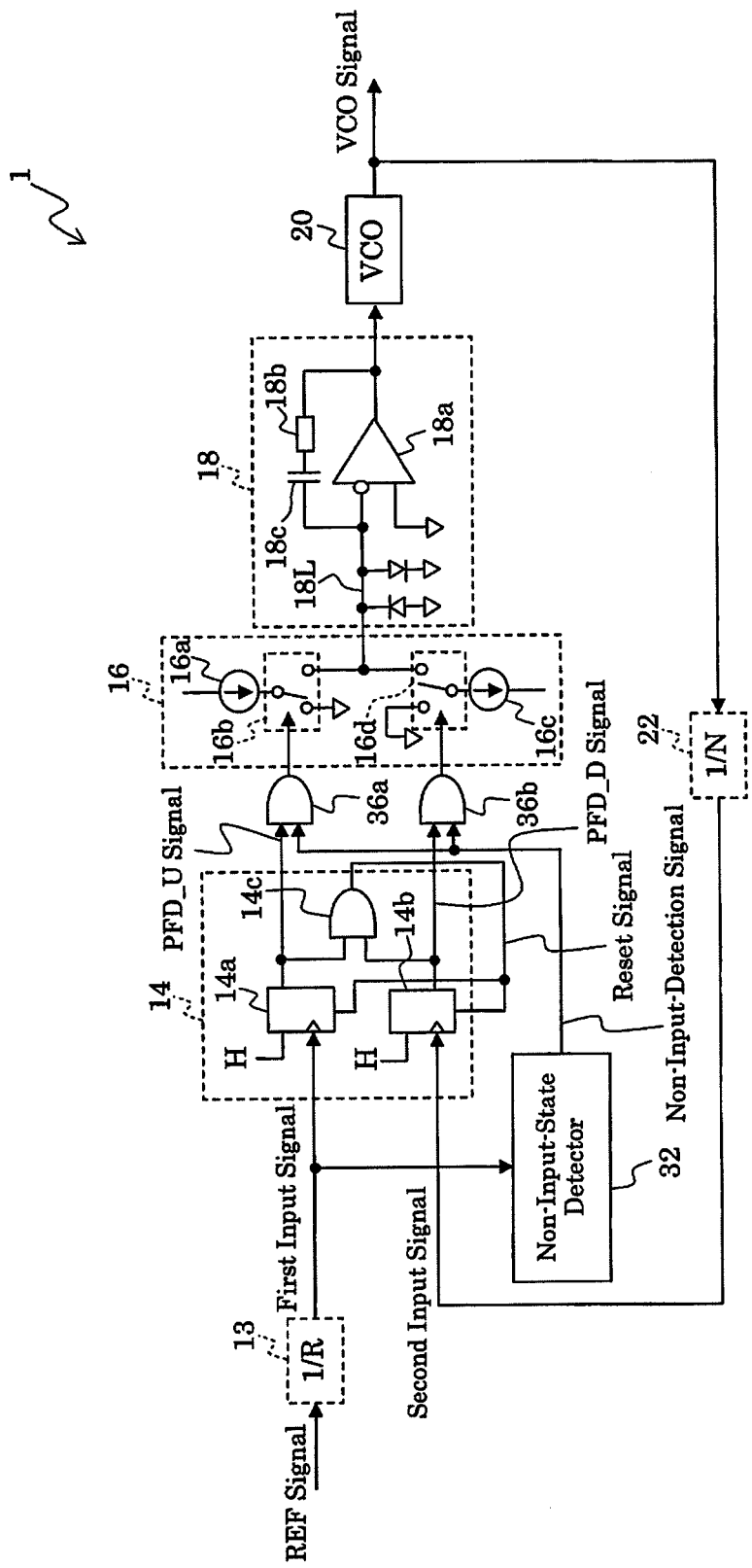
FIG. 9 is a diagram showing a configuration of the PLL circuit 1 according to the fifth embodiment of the present invention.

FIG. 9 is a diagram showing a configuration of the PLL circuit 1 according to the fifth embodiment of the present invention. The PLL circuit 1 according to the fifth embodiment includes the frequency divider 13, the phase comparator 14, the charge pump circuit 16, the loop filter 18, the VCO (Voltage Controlled Oscillator) 20, the frequency divider 22, the non-input-state detector 32, and the AND circuits (phase-difference-pulse relay units) 36a, 36b. In the following section, the same components are denoted by the same numerals as of the first embodiment, and will be explained in no more details.

The frequency divider 13, the phase comparator 14, the charge pump circuit 16, the loop filter 18, the VCO 20, the frequency divider 22, and the non-input-state detector 32 are the same as those of the first embodiment, and hence a description thereof is omitted.

It should be noted that the output of the AND circuit 14c of the phase comparator 14 is fed to the reset terminals of the REF-side flip-flop 14a and the VCO-side flip-flop 14b. When the output of the AND circuit 14c is at the H (High) level, it is considered that the reset signal is output. When the output of the AND circuit 14c is L (low), it is considered that the reset signal is not output.

Moreover, the non-input-state detector 32 receives the first input signal, and, when the first input signal stays in the L level for a predetermined period, outputs a non-input-detection signal at the L (Low) level. When the non-input-detection signal is not output, the output of the non-input-state detector 32 is at the H (High) level.

It should be noted that the non-input-state detector 32 and the AND circuits (phase-difference-pulse relay units) 36a, 36b constitute the phase-difference-pulse stop unit.

The AND circuits (phase-difference-pulse relay units) 36a, 36b receive the phase difference pulses (PFD_U signal and the PFD_D signal), and feed them to the charge pump circuit 16. The AND circuits 36a, 36b do not feed the phase difference pulses to the charge pump circuit 16 in the non-input state. In more detail, the AND circuits 36a, 36b receive the detection of the non-input state (non-input-detection signal (level is L)) by the non-input-state detector 32, preventing the phase difference pulses from being fed to the charge pump circuit 16.

The AND circuit 36a receives the output of the non-input-state detector 32 and the output of the REF-side flip-flop 14a, and outputs a signal at the H level when both of them are at the H level. In the other cases, the AND circuit 36a outputs a signal at the L level.

As a result, the AND circuit 36a receives the detection of the non-input state (non-input-detection signal (level is L)) by the non-input-state detector 32, and outputs the signal at the L level. As a result, even if the PFD_U signal, which is the phase difference pulse, is output from the REF-side flip-flop 14a, the phase difference pulse (PFD_U signal) is not fed to the charge pump circuit 16.

On the other hand, when the non-input state is not detected by the non-input-state detector 32, the AND circuit 36a receives the output (level is H) of the non-input-state detector 32. As a result, when the PFD_U signal (level is H), which is the phase difference pulse, is output from the REF-side flip-flop 14a, the signal at the H level is output from the AND circuit 36a. Thus, when the non-input state is not detected by the non-input-state detector 32, the AND circuit 36a receives the phase difference pulse (PFD_U signal), and feeds the phase difference pulse to the charge pump circuit 16.

The AND circuit 36b receives the output of the non-input-state detector 32 and the output of the VCO-side flip-flop 14b, and outputs a signal at the H level when both of them are at the H level. In the other cases, the AND circuit 36b outputs a signal at the L level.

As a result, the AND circuit 36b receives the detection of the non-input state (non-input-detection signal (level is L)) by the non-input-state detector 32, and outputs the signal at the L level. As a result, even if the PFD_D signal, which is the phase difference pulse, is output from the VCO-side flip-flop 14b, the phase difference pulse (PFD_D signal) is not fed to the charge pump circuit 16.

On the other hand, when the non-input state is not detected by the non-input-state detector 32, the AND circuit 36b receives the output (level is H) of the non-input-state detector 32. As a result, when the PFD_D signal (level is H), which is the phase difference pulse, is output from the VCO-side flip-flop 14b, the signal at the H level is output from the AND circuit 36b. Thus, when the non-input state is not detected by the non-input-state detector 32, the AND circuit 36b receives the phase difference pulse (PFD_D signal), and feeds the phase difference pulse to the charge pump circuit 16.

A description will now be given of an operation of the fifth embodiment.

The state of the signals when the state in which the REF signal (first input signal) is not input changes to the state in which the REF signal is input is approximately the same as the state of the signals of the PLL circuit 1 according to the first embodiment described referring to FIG. 2.

However, the levels L and H of the non-input-detection signal are inversed with respect to the state in FIG. 2. In other words, before the time t2 in FIG. 2, the non-input-detection signal is output (the output level is L (Low)), and, after the time t2, the non-input-detection signal is not output (the output level is H (High)). Regardless of the level of the non-input-detection signal, after the output of the REF signal, the reset signal goes H.

Moreover, the states of the PFD_U signal and the PFD_D signal fed to the charge pump circuit 16 are the same as the states of the PFD_U signal and the PFD_D signal shown in FIG. 2.

In other words, the non-input-detection signal is output from the non-input-state detector 32 before the time t2 (output level is L), and is fed to the AND circuits 36a, 36b. As a result, the AND circuits 36a, 36b output the signals at the L level, and feed the signals to the charge pump circuit 16. Therefore, the PFD_U signal and the PFD_D signal are not fed to the charge pump circuit 16.

Moreover, after the time t2, the non-input-detection signal is not output from the non-input-state detector 32. Thus, the non-input-state detector 32 outputs the signal at the H level, and the output signal is fed to the AND circuits 36a, 36b. Therefore, when the PFD_U signal (level is H), which is the phase difference pulse, is output from the REF-side flip-flop 14a, the signal at the H level is output from the AND circuit 36a. Moreover, when the PFD_D signal (level is H), which is the phase difference pulse, is output from the VCO-side flip-flop 14b, the signal at the H level is output from the AND circuit 36b. Therefore, when the PFD_U signal and the PFD_D signal are output from the phase comparator 14 after the time t2, they are fed to the charge pump circuit 16.

The state of the signals when the state in which the REF signal (first input signal) is input changes to the state in which the REF signal is not input is approximately the same as the state of the signals of the PLL circuit 1 according to the first embodiment described referring to FIG. 3.

However, the levels L and H of the non-input-detection signal are inversed with respect to the state in FIG. 3. In other words, at the time t8 in FIG. 3 (more precisely, slightly before the time t8), the level of the non-input-detection signal changes from H to L. The level of the reset signal remains L after the time t8.

Moreover, the states of the PFD_U signal and the PFD_D signal fed to the charge pump circuit 16 are the same as the states of the PFD_U signal and the PFD_D signal shown in FIG. 3.

In other words, before the time t8, the non-input-detection signal is not output from the non-input-state detector 32. Thus, the non-input-state detector 32 outputs the signal at the H level, and the output signal is fed to the AND circuits 36a, 36b. Therefore, when the PFD_U signal (level is H), which is the phase difference pulse, is output from the REF-side flip-flop 14a, the signal at the H level is output from the AND circuit 36a. Moreover, when the PFD_D signal (level is H), which is the phase difference pulse, is output from the VCO-side flip-flop 14b, the signal at the H level is output from the AND circuit 36b. Therefore, when the PFD_U signal and the PFD_D signal are output from the phase comparator 14 before the time t8, they are fed to the charge pump circuit 16.

Moreover, the non-input-detection signal is output from the non-input-state detector 32 after the time t8 (output level is L), and is fed to the AND circuits 36a, 36b. As a result, the AND circuits 36a, 36b output the signals at the L level, and feed the signals to the charge pump circuit 16. Therefore, the PFD_U signal and the PFD_D signal are not fed to the charge pump circuit 16.

If the phase-difference-pulse stop unit were not present, the output of the PFD_D signal would continue, and the input of the negative current to the loop filter 18 would continues (the flow-out of the charge from the loop filter 18 would continue). As a result, the saturation would be generated in the operational amplifier 18a. This causes degradation in phase settling when the operational amplifier 18a recovers from the saturation. Further, this also causes degradation in phase settling caused by a heat balance between differential operations of the switches 16b and 16d of the charge pump circuit 16.

However, according to the fifth embodiment, a phase-difference-pulse stop unit (including non-input-state detector 32 and the AND circuits (phase-difference-pulse relay units) 36a, 36b) exists, and, thus, even if the PFD_D signal is output from the VCO-side flip-flop 14b at the time t8 when the level of the non-input-detection signal changes from H to L, the phase difference pulse (PFD_D signal) is not fed to the charge pump circuit 16. As a result, it is possible to restrain the period in which the feed of the PFD_D signal to the charge pump circuit 16 continues to the period from the time t7 to the time t8, resulting in a reduction of the period in which the input of the negative current to the loop filter 18 continues. In this way, it is possible to prevent the flow of the current to the charge pump circuit 16 from the loop filter 18 from continuing.

Sixth Embodiment

The PLL circuit 1 according to a sixth embodiment is different from the PLL circuit 1 according to the fifth embodiment in that the PLL circuit 1 according to the sixth embodiment includes the delay element 2.

Figure 10:
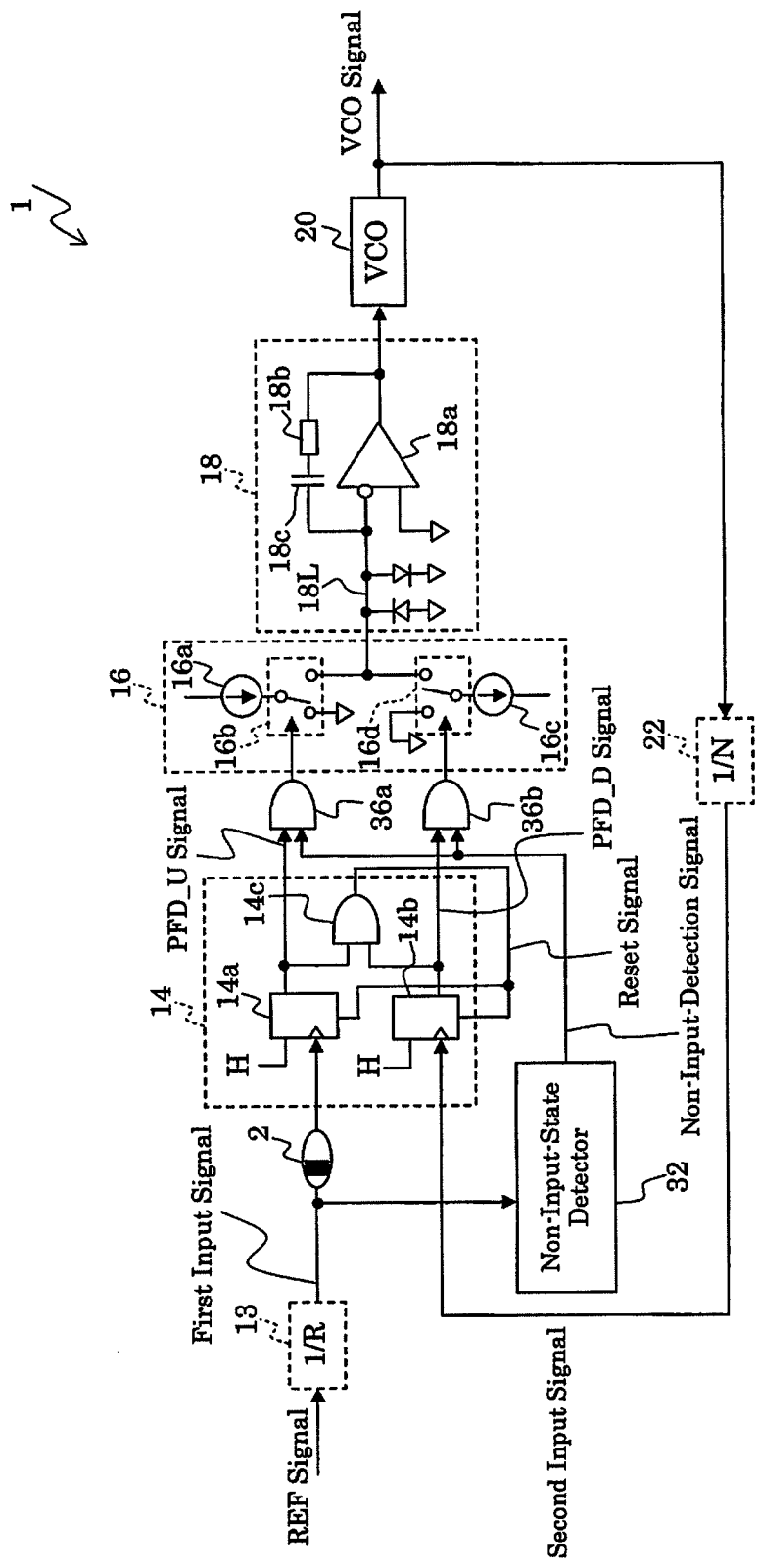
FIG. 10 is a diagram showing a configuration of the PLL circuit 1 according to the sixth embodiment of the present invention.

FIG. 10 is a diagram showing a configuration of the PLL circuit 1 according to the sixth embodiment of the present invention. The PLL circuit 1 according to the sixth embodiment includes the delay element 2, the frequency divider 13, the phase comparator 14, the charge pump circuit 16, the loop filter 18, the VCO (Voltage Controlled Oscillator) 20, the frequency divider 22, the non-input-state detector 32, and the AND circuits (phase-difference-pulse relay units) 36a, 36b.

In the following section, the same components are denoted by the same numerals as of the fifth embodiment, and will be explained in no more details.

The frequency divider 13, the phase comparator 14, the charge pump circuit 16, the loop filter 18, the VCO (Voltage Controlled Oscillator) 20, the frequency divider 22, the non-input-state detector 32 and the AND circuits (phase-difference-pulse relay units) 36a, 36b are the same as those of the first embodiment, and hence a description thereof is omitted.

The delay element 2 delays the first input signal (REF signal), and feeds the delayed signal to the REF-side flip-flop 14a of the phase comparator 14. However, the first input signal fed to the non-input-state detector 32 of the phase-difference-pulse stop unit is not delayed by the delay element 2. Moreover, the delay of the first input signal caused by the delay element 2 (delay time) is denoted by T1.

A description will now be given of an operation of the sixth embodiment.

The state of the signals when the state in which the REF signal (first input signal) is not input changes to the state in which the REF signal is input according to the sixth embodiment is approximately the same as the state of the signals of the PLL circuit 1 according to the second embodiment described referring to FIG. 5.

However, the levels L and H of the non-input-detection signal are inversed with respect to the state in FIG. 5. In other words, before the time t2 in FIG. 5, the non-input-detection signal is output (the output level is L (Low)), and, after the time t2, the non-input-detection signal is not output (the output level is H (High)). Regardless of the level of the non-input-detection signal, after the output of the VCO signal, the reset signal goes H.

Moreover, the states of the PFD_U signal and the PFD_D signal fed to the charge pump circuit 16 are the same as the states of the PFD_U signal and the PFD_D signal shown in FIG. 5. There is no difference from the fifth embodiment except that the REF signal is delayed, and is then fed to the REF-side flip-flop 14a of the phase comparator 14.

A period from the time point t1 when the reference pulse (REF signal) is input for the first time to the time point t2 when the non-input-state detector 32 stops the output of the non-input-detection signal indicating the detection of the non-input state is denoted by T2. Moreover, it is assumed that a relationship T1=T2 holds.

The state of the signals when the state in which the REF signal (first input signal) is input changes to the state in which the REF signal is not input is approximately the same as the state of the signals of the PLL circuit 1 according to the second embodiment described referring to FIG. 6.

However, the levels L and H of the non-input-detection signal are inversed with respect to the state in FIG. 6. In other words, the level of the non-input-detection signal changes from H to L at the time t10 in FIG. 6. The level of the reset signal remains L after the time t8. It should be noted that the non-input-detection signal (level is L) causes the outputs of the AND circuits 36a, 36b to maintain the L level after the time t8. A period from the time t10 to the time t8 is a delay time caused by the processing in the AND circuits 36a, 36b and the like.

Moreover, the states of the PFD_U signal and the PFD_D signal fed to the charge pump circuit 16 are the same as the states of the PFD_U signal and the PFD_D signal shown in FIG. 6.

On this occasion, a period from the time point t9 when the reference pulse (REF signal) is input for the last time to the time point t10 when the non-input-state detector 32 outputs the non-input-detection signal indicating the detection of the non-input state is referred to as detection response time. Moreover, it is assumed that the detection response time is equal to T2.

Even after the time t9, the feed of the REF signal delayed by the delay element 2 to the REF-side flip-flop 14a of the phase comparator 14 continues. Moreover, the feed of the delayed REF signal and the feed of the VCO signal to the phase comparator 14 start almost simultaneously, and continue. As a result, the operation in which the reset signal is output after the PFD_U signal and the PFD_D signal are output for a short period, and the outputs of the PFD_U signal and the PFD_D signal are stopped is repeated as the operation after the time t5 in FIG. 2. After the time t7a (the VCO signal (output pulse) rises for the first time after the time t9), this operation repeats similarly.

Moreover, the non-input-detection signal is not output from the non-input-state detector 32 until the time t8 (even after the time t9). Thus, the non-input-state detector 32 outputs the signal at the H level, and the output signal is fed to the AND circuits 36a, 36b. Therefore, when the PFD_U signal (level is H), which is the phase difference pulse, is output from the REF-side flip-flop 14a, the signal at the H level is output from the AND circuit 36a. Moreover, when the PFD_D signal (level is H), which is the phase difference pulse, is output from the VCO-side flip-flop 14b, the signal at the H level is output from the AND circuit 36b. Therefore, when the PFD_U signal and the PFD_D signal are output from the phase comparator 14 before the time t8 (even after the time t9), they are fed to the charge pump circuit 16.

Moreover, the non-input-detection signal is output from the non-input-state detector 32 after the time t8 (output level is L), and is fed to the AND circuits 36a, 36b. As a result, the AND circuits 36a, 36b output the signals at the L level, and feed the signals to the charge pump circuit 16. Therefore, the PFD_U signal and the PFD_D signal are not fed to the charge pump circuit 16.

According to the sixth embodiment, since the phase-difference-pulse stop unit exists, the PFD_U signal and the PFD_D signal are no longer fed to the charge pump circuit 16 after the time t8. This is the same effect as that of the fifth embodiment.

Moreover, according to the sixth embodiment, the REF signal is delayed by the delay element 2, and is then fed to the phase comparator 14, and it is thus possible to prevent the PFD_D signal from being fed to the charge pump circuit 16 in the period from the time t7a to the time t8 (the PFD_D signal is output intermittently). The time t7a coincides with the time t7 according to the first and fifth embodiments if the delay by the delay element 2 is not present. Thus, it is possible to more efficiently prevent the PFD_D signal from being fed to the charge pump circuit 16 compared with the first embodiment in which the output of the PFD_D signal continues from the time t7 to the time t8 (refer to FIG. 3). In this way, it is possible to more efficiently prevent the flow of the current to the charge pump circuit 16 from the loop filter 18 from continuing than the first and fifth embodiments.

The description is given of the case in which the detection response time T2 and the delay time T1 are the same. Though the delay time T1 and the detection response time T2 are preferably the same, the relationship therebetween may be (delay time T1)>(detection response time T2).

Seventh Embodiment

The PLL circuit 1 according to a seventh embodiment is different from the PLL circuit 1 according to the fifth embodiment in the point that the REF signal is input from the waveform generator 12 disposed outside the PLL circuit 1. Moreover, the PLL circuit 1 according to the seventh embodiment is different from the PLL circuit 1 according to the fifth embodiment in the point that the non-input-detection signal is not obtained from the non-input-state detector 32, but the non-input-state signal is obtained from the waveform generator 12.

Figure 11:
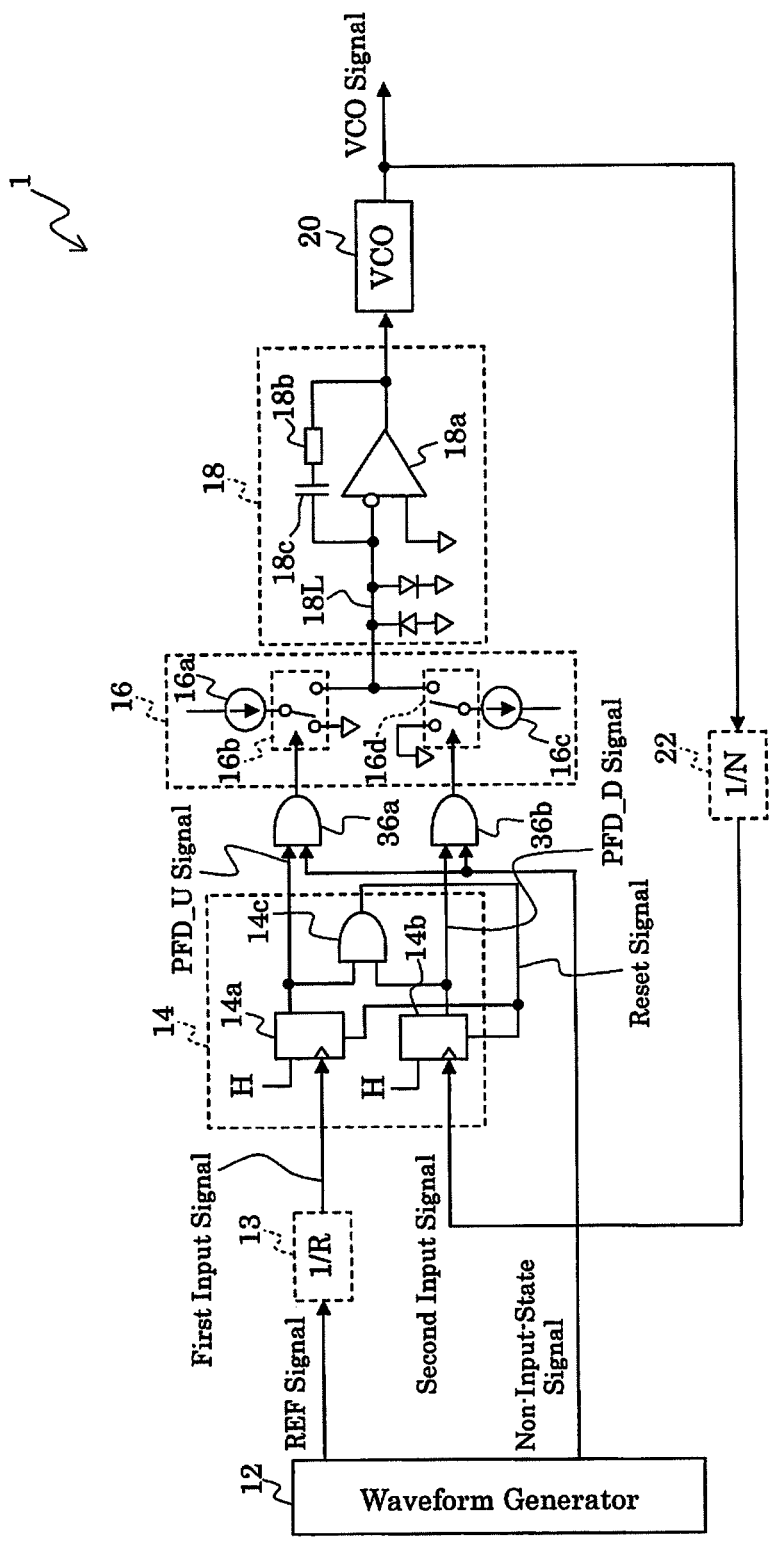
FIG. 11 is a diagram showing a configuration of the PLL circuit 1 according to the seventh embodiment of the present invention.

FIG. 11 is a diagram showing a configuration of the PLL circuit 1 according to the seventh embodiment of the present invention. The PLL circuit 1 according to the seventh embodiment is connected to the waveform generator (reference pulse generation device) 12. The PLL circuit 1 according to the seventh embodiment includes the frequency divider 13, the phase comparator 14, the charge pump circuit 16, the loop filter 18, the VCO (Voltage Controlled Oscillator) 20, the frequency divider 22, and the AND circuits (phase-difference-pulse relay units) 36a, 36b. In the following section, the same components are denoted by the same numerals as of the fifth embodiment, and will be explained in no more details.

The frequency divider 13, the phase comparator 14, the charge pump circuit 16, the loop filter 18, the VCO 20, and the frequency divider 22 are the same as those of the fifth embodiment, and hence a description thereof is omitted.

The waveform generator (reference pulse generation device) 12 generates the REF signal (reference pulse). Moreover, the waveform generator 12 outputs the non-input-state signal indicating the non-input state in which the REF signal (reference pulse) is not input to the PLL circuit 1. The non-input-state signal is similar to the non-input-detection signal described in the second embodiment, and is a signal when the detection response time T2 according to the second embodiment is approximately 0. However, the levels H (High) and L (Low) of the non-input-state signal are inversed with respect to the non-input-detection signal according to the second embodiment.

The phase-difference-pulse stop unit according to the seventh embodiment includes the AND circuits 36a, 36b.

The AND circuit 36a receives the non-input-state signal and the output of the REF-side flip-flop 14a, and outputs a signal at the H level when both of them are at the H level. In the other cases, the AND circuit 36a outputs a signal at the L level.

As a result, the AND circuit 36a receives the non-input-state signal (level is L) from the waveform generator (reference pulse generation device) 12, and outputs the signal at the L level. In other words, the AND circuit 36a prevents the output (PFD_U signal which is the phase difference pulse) from the phase comparator 14 from being fed to the charge pump circuit 16.

The AND circuit 36b receives the non-input-state signal and the output of the VCO-side flip-flop 14b, and outputs a signal at the H level when both of them are at the H level. In the other cases, the AND circuit 36b outputs a signal at the L level.

As a result, the AND circuit 36b receives the non-input-state signal (level is L) from the waveform generator (reference pulse generation device) 12, and outputs the signal at the L level. In other words, the AND circuit 36b prevents the output (PFD_D signal which is the phase difference pulse) from the phase comparator 14 from being fed to the charge pump circuit 16.

When the output of the waveform generator (reference pulse generation device) 12 is at the H level (the non-input-state signal is not output), the AND circuits 36a, 36b feed the PFD_U signal and the PFD_D signal to the charge pump circuit 16 as in the fifth embodiment.

An operation of the seventh embodiment is the same as the operation of the fifth embodiment, and hence a description thereof is omitted. However, the time t1 and the time t2 are approximately simultaneous (refer to FIG. 2). Moreover, the time t6 (time when the REF signal and the VCO signal are simultaneously input for the last time) and the time when the non-input-state signal is output are approximately simultaneous, and, at the time t7 (the time point when the VCO signal rises for the first time after the time t6), the PFD_D signal is not fed to the charge pump circuit 16 (refer to FIG. 3).

According to the seventh embodiment, since the phase-difference-pulse stop unit exists, when the time the non-input-state signal is output is reached, the PFD_U signal and the PFD_D signal are not fed to the charge pump circuit 16. This is the same effect as that of the fifth embodiment.

Moreover, according to the seventh embodiment, the time t6 and the time when the non-input-state signal is output are approximately simultaneous, and the PFD_D signal is thus not output at the time t7. Thus, it is possible to more efficiently reduce the continuous output of the PFD_D signal compared with the first and fifth embodiments in which the output of the PFD_D signal continues from the time t7 to the time t8 (refer to FIG. 3). In this way, it is possible to more efficiently prevent the flow of the current to the charge pump circuit 16 from the loop filter 18 from continuing than the first and fifth embodiments.

As a variation of the seventh embodiment, it is conceivable that the non-input state is set after the non-input-state signal is output from the waveform generator 12 and while the non-input-state signal is output from the waveform generator 12.

Consequently, the time point when the REF signal is stopped may be set in a period when the non-input-state signal is output from the waveform generator 12, and a labor required for designing a circuit for the waveform generator 12 is thus reduced.

Eighth Embodiment

The PLL circuit 1 according to an eighth embodiment is different from the PLL circuit 1 according to the seventh embodiment in that the non-input-state signal is acquired from the waveform generation control unit 11 which controls the waveform generator 12.

Figure 12:
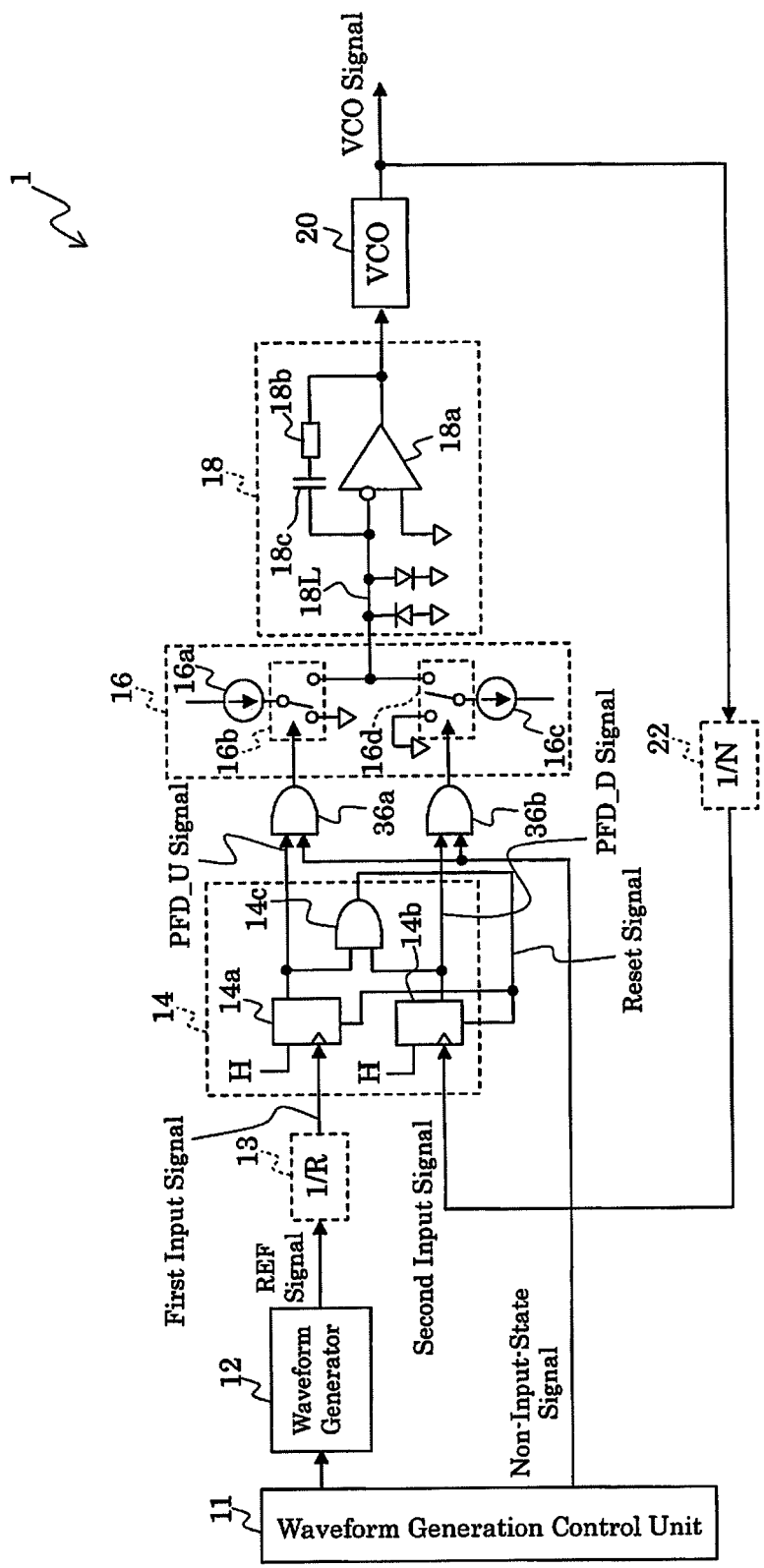
FIG. 12 is a diagram showing a configuration of the PLL circuit 1 according to the eighth embodiment of the present invention.

FIG. 12 is a diagram showing a configuration of the PLL circuit 1 according to the eighth embodiment of the present invention. The PLL circuit 1 according to the eighth embodiment is connected to the waveform generation control unit 11 and the waveform generator 12 which constitute the reference pulse generation device. The PLL circuit 1 according to the eighth embodiment includes the frequency divider 13, the phase comparator 14, the charge pump circuit 16, the loop filter 18, the VCO (Voltage Controlled Oscillator) 20, the frequency divider 22, and the AND circuits (phase-difference-pulse relay units) 36a, 36b. In the following section, the same components are denoted by the same numerals as of the seventh embodiment, and will be explained in no more details.

The frequency divider 13, the phase comparator 14, the charge pump circuit 16, the loop filter 18, the VCO 20, the frequency divider 22, and the AND circuits (phase-difference-pulse relay units) 36a, 36b are the same as those of the seventh embodiment, and hence a description thereof is omitted.

The waveform generator (reference pulse generation device) 12 generates the REF signal (reference pulse).

The waveform generation control unit (reference pulse generation device) 11 controls a timing in which the waveform generator 12 generates the REF signal (reference pulse). Moreover, the waveform generation control unit 11 outputs the non-input-state signal indicating the non-input state in which the REF signal (reference pulse) is not input to the PLL circuit 1. It should be noted that the non-input-state signal is the same as the non-input-state signal described in the seventh embodiment.

The waveform generation control unit 11 may be realized as an electronic circuit. Moreover, the waveform generation control unit 11 may be realized by causing a computer provided with a CPU, a hard disk, and a media (such as a floppy disk (registered trade mark) and a CD-ROM) reader to read a medium recording a program, thereby installing the program on the hard disk.

An operation of the eighth embodiment is the same as the operation of the seventh embodiment, and hence a description thereof is omitted.

According to the eighth embodiment, there are obtained the same effects as in the seventh embodiment.

As a variation of the eighth embodiment, it is conceivable that the non-input state is set after the non-input-state signal is output from the waveform generation control unit 11 and while the non-input-state signal is output from the waveform generation control unit 11.

Consequently, the time point when the REF signal is stopped may be set in a period while the non-input-state signal is output from the waveform generation control unit 11, and a labor required for designing a circuit for the waveform generation control unit 11 is thus reduced.

The invention claimed is:

1. A PLL circuit which receives an input of a reference pulse, and outputs an output pulse, comprising:
   a voltage controlled oscillator that outputs the output pulse having a frequency according to an input voltage;
   a loop filter that feeds a voltage according to an input current to the voltage controlled oscillator;
   a phase comparator that outputs a phase difference pulse having a width according to a phase difference between a first input signal and a second input signal;
   a charge pump circuit that receives the phase difference pulse, and inputs the current to the loop filter; and
   a phase-difference-pulse stop unit that stops the input of the phase difference pulse to the charge pump circuit in a non-input state in which the reference pulse is not input, wherein:
   the first input signal is a signal based on the reference pulse; and
   the second input signal is a signal based on the output pulse,
   wherein the phase-difference-pulse stop unit stops the output of the phase difference pulse from the phase comparator in the non-input state, and
   wherein the phase-difference-pulse stop unit includes a non-input-state detector that detects the non-input state in which the first input signal is not input, and receives a detection of the non-input state by the non-input-state detector, thereby stopping the output of the phase difference pulse from the phase comparator.

2. The PLL circuit according to claim 1, wherein:
   the first input signal is the reference pulse itself, or a pulse obtained by dividing the frequency of the reference pulse; and
   the second input signal is the output pulse itself, or a pulse obtained by dividing the frequency of the output pulse.

3. The PLL circuit according to claim 1,
   wherein the charge pump circuit inputs a positive current to the loop filter when the frequency of the second input signal is lower than the frequency of the first input signal, and inputs a negative current to the loop filter when the frequency of the second input signal is higher than the frequency of the first input signal.

4. The PLL circuit according to claim 1, further comprising:
   a delay element that delays the first input signal, and feeds the delayed first input signal to the phase comparator.

5. The PLL circuit according to claim 4,
   wherein the delay time by the delay element is equal to or longer than a detection response time which is from a time point when the reference pulse is input for the last time to a time point when the non-input-state detector detects the non-input state and outputs a non-input-detection signal.

6. The PLL circuit according to claim 1,
   wherein the phase-difference-pulse stop unit receives a non-input-state signal indicating the non-input state from a reference pulse generation device that generates the reference pulse, thereby stopping the output of the phase difference pulse from the phase comparator.

7. The PLL circuit according to claim 6,
   wherein the non-input state is set while the non-input-state signal is output from the reference pulse generation device.

8. The PLL circuit according to claim 1, wherein:
   the phase-difference-pulse stop unit includes a phase-difference-pulse relay unit that receives the phase difference pulse, and feeds the phase difference pulse to the charge pump circuit; and
   the phase-difference-pulse relay unit does not feed the phase difference pulse to the charge pump circuit in the non-input state.

9. The PLL circuit according to claim 8, wherein:
   the phase-difference-pulse stop unit includes a non-input-state detector that detects the non-input state in which the reference pulse is not input; and
   the phase-difference-pulse relay unit receives a detection of the non-input state by the non-input-state detector, thereby preventing the phase difference pulse from being fed to the charge pump circuit.

10. The PLL circuit according to claim 9, further comprising:
    a delay element that delays the first input signal, and feeds the delayed first input signal to the phase comparator.

11. The PLL circuit according to claim 10,
    wherein the delay time by the delay element is equal to or longer than a detection response time which is from a time point when the reference pulse is input for the last time to a time point when the non-input-state detector detects the non-input state and outputs a non-input-detection signal.

12. The PLL circuit according to claim 8,
    wherein the phase-difference-pulse relay unit receives a non-input-state signal indicating the non-input state from a reference pulse generation device that generates the reference pulse, thereby preventing the phase difference pulse from being fed to the charge pump circuit.

13. The PLL circuit according to claim 12,
    wherein the non-input state is set while the non-input-state signal is output from the reference pulse generation device.

14. A method of using a PLL circuit which receives an input of a reference pulse, and outputs an output pulse, wherein the PLL circuit comprising:
    a voltage controlled oscillator that outputs the output pulse having a frequency according to an input voltage;

a loop filter that feeds a voltage according to an input current to the voltage controlled oscillator;

a phase comparator that outputs a phase difference pulse having a width according to a phase difference between a first input signal and a second input signal; and a charge pump circuit that receives the phase difference pulse, and inputs the current to the loop filter, wherein the first input signal is a signal based on the reference pulse and the second input signal is a signal based on the output pulse, said method comprising:

stopping the input of the phase difference pulse to the charge pump circuit after at least one period of the first input signal has passed since a non-input state, in which the reference pulse is not input, begins, wherein a phase-difference-pulse stop unit stops the output of the phase difference pulse from the phase comparator in the non-input state, and wherein the phase-difference-pulse stop unit includes a non-input-state detector that detects the non-input state in which the first input signal is not input, and receives a detection of the non-input state by the non-input-state detector, thereby stopping the output of the phase difference pulse from the phase comparator.

15. The PLL circuit according to claim 1, comprising only one said phase comparator.

16. The PLL circuit according to claim 1, wherein the phase-difference-pulse stop unit stops the input of the phase difference pulse after at least one period of the first input signal has passed since the non-input state begins.

\* \* \* \* \*